(12) United States Patent
Maekawa et al.

(10) Patent No.: US 6,518,104 B2
(45) Date of Patent: *Feb. 11, 2003

(54) METHOD OF MANUFACTURING A SEMICONDUCTOR DEVICE BY THERMAL OXIDATION OF AN IMPURITY DOPED AMORPHOUS SEMICONDUCTOR FILM

(75) Inventors: Shinji Maekawa, Atsugi (JP); Hisashi Ohtani, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/901,619

(22) Filed: Jul. 11, 2001

(65) Prior Publication Data

US 2001/0046729 A1 Nov. 29, 2001

Related U.S. Application Data

(62) Division of application No. 09/313,081, filed on May 17, 1999, now Pat. No. 6,261,971.

(30) Foreign Application Priority Data

May 19, 1998 (JP) .......................................... 10-136316

(51) Int. Cl.[7] .......................... H01L 21/20; H01L 21/84
(52) U.S. Cl. ...................... 438/151; 438/152; 438/161; 438/166
(58) Field of Search ................................ 438/151, 766, 438/149, 142, 765, 758, 798, 423, 152, 161, 166, 184

(56) References Cited

U.S. PATENT DOCUMENTS

| | | | |
|---|---|---|---|
| 4,437,225 A | 3/1984 | Mizutani | |
| 5,631,189 A * | 5/1997 | Kobayashi et al. | 438/440 |
| 5,811,323 A | 9/1998 | Miyasaka et al. | |
| 5,930,617 A * | 7/1999 | Wu | 438/231 |
| 5,930,643 A | 7/1999 | Sadana et al. | |
| 5,989,945 A * | 11/1999 | Yudasaka et al. | 257/347 |
| 6,022,751 A | 2/2000 | Shindo et al. | |
| 6,096,614 A * | 8/2000 | Wu | 257/408 |
| 6,136,636 A * | 10/2000 | Wu | 438/231 |
| 6,261,971 B1 * | 7/2001 | Maekawa et al. | 438/151 |
| 6,268,842 B1 * | 7/2001 | Yamazaki et al. | 330/257 |

FOREIGN PATENT DOCUMENTS

| | | |
|---|---|---|
| JP | 06-13607 | 1/1994 |
| JP | 07-30122 | 1/1995 |

* cited by examiner

*Primary Examiner*—Michael S. Lebentritt
(74) *Attorney, Agent, or Firm*—Eric J. Robinson; Robinson Intellectual Property Law Office, P.C.

(57) ABSTRACT

In a method of manufacturing a TFT using a crystalline silicon film in which defects are compensated by a thermal oxidation step, the roughness of a thermal oxidation film formed by thermal oxidation is made small. In the method, first, an amorphous silicon film to which an impurity for suppressing crystallization, such as nitrogen, oxygen, or carbon, is formed on a crystalline silicon film used as an active layer. Since crystallization of this amorphous silicon film is suppressed, it can be thermally oxidized in the state of an amorphous or microcrystalline, and the thermal oxidation film with small roughness can be obtained. By using this thermal oxidation step, it is possible to suppresses generation of a gate leak, to suppresses fluctuation of TFT characteristics in the same substrate to the minimum, and to manufacture a semiconductor device capable of operating at high speed.

24 Claims, 9 Drawing Sheets

METHOD OF MANUFACTURING A SEMICONDUCTOR DEVICE BY THERMAL OXIDATION OF AN IMPURITY DOPED AMORPHOUS SEMICONDUCTOR FILM

BACKGROUND OF THE INVENTION

1. Field of the Invention

The present invention relates to a technique concerning a method of manufacturing a semiconductor device using a semiconductor film, and particularly to a method of manufacturing a semiconductor device including a thin film transistor (hereinafter abbreviated to TFT) using a crystalline silicon film.

Incidentally, in the present specification, the semiconductor device indicates any device functioning with semiconductor, and includes not only a single component such as a TFT but also an electro-optical device, a semiconductor circuit, and an electronic equipment incorporating those.

2. Description of Related Art

In recent years, a TFT used for an electro-optical device such as an active matrix type liquid crystal display device has been actively developed.

With respect to the active matrix type liquid crystal display device, a monolithic type display device in which a liquid crystal display portion and a driver circuit portion are provided on the same substrate becomes the mainstream. Moreover, a system-on-panel having a built-in logic circuit portion, such as a gamma correcting circuit, a memory circuit, and a clock generating circuit, has been developed. Since such a driver circuit portion and a logic circuit portion require a high mobility, a TFT using a crystalline silicon film (polysilicon film) is used. When the crystal grain diameter of the crystalline silicon film is large, a TFT with an extremely high mobility can be obtained.

The TFT using the crystalline silicon film is generally a coplanar type, and a semiconductor technique such as thermal oxidation or ion implantation can be applied. It is considered that especially when a thermal oxidation step is used, defects of a silicon film are compensated, so that TFT characteristics such as mobility, subthreshold coefficient, and threshold voltage are improved, and an extremely excellent switching characteristic and a high speed operation characteristic can be realized.

A mechanism of defect compensation by thermal oxidation has been considered as follows. In thermal oxidation of a silicon film, oxygen diffuses in a thermal oxidation film (silicon oxide film) and reaches an interface of $SiO_2/Si$, where an oxidation reaction occurs so that a new thermal oxidation film is formed. When silicon is oxidized to become silicon oxide, about double expansion by volume occurs. For the purpose of causing oxidation to progress in a closed state of the interface, it is necessary to secure a space for volume expansion. Surplus silicon atoms diffuse, as inter-lattice silicon atoms, through a silicon oxide film or silicon film in just the state they are unreacted. It is considered that the reason why the characteristics of a TFT using a crystalline silicon film is improved by a thermal oxidation step, is that the inter-lattice silicon atoms are supplied to lattice defects, such as grain boundaries of the crystalline silicon film or defects in grains, so that the defects are compensated. Since a crystalline silicon film in which defects are compensated can be formed by the thermal oxidation step, the thermal oxidation step is a very useful technique in manufacture of a TFT with a high mobility.

However, when a crystalline silicon film 301 shown in FIG. 2A is thermally oxidized, roughness is formed on the interface between a thermal oxidation film 302 and a crystalline silicon 30 film 303 or on the surface of the thermal oxidation film 302 as shown in FIG. 2B, and the thickness of the crystalline silicon film 303 used as an active layer becomes irregular, so that there rises such a problem that fluctuation in TFT characteristics occurs in the same substrate. Thus, the thermal oxidation step cannot be directly used. Since the thermal oxidation film is a dense film, its insulating property is excellent and it is a film suitable for a gate insulating film. However, when the thermal oxidation film 302 obtained by thermal oxidation of the crystalline silicon film is used as the gate insulating film, since the film thickness does not become uniform by the formation of roughness, a gate voltage is concentrated on a thin portion of the film thickness so that it may cause breakdown.

Formation of the roughness of the thermal oxidation film is caused by the fact that the oxidation speed of the crystalline silicon film is different in different places. The oxidation speed is different by the difference in plane orientation of each crystal, and is also different between a crystal and a crystal grain boundary. Especially, as compared with a crystal, an oxidation speed at a crystal grain boundary is fast, and oxidation progresses selectively from the crystal grain boundary, which contributes largely to the formation of roughness. Especially, when crystals with large grain diameters are thermally oxidized, irregular roughness is formed so that it has not been preferable. However, as described above, in order to realize a TFT with a high mobility, it is preferable to increase the crystal grain diameter of a crystalline silicon film used as an active layer. Thus, such a countermeasure has been adopted that an active layer is not directly thermally oxidized, but a silicon film with crystal grains of uniform small diameters is formed on a crystalline silicon film used as an active layer, and this silicon film is thermally oxidized.

Like this, when the crystalline silicon film with a uniform small crystal grain diameter is formed on the crystalline silicon film used as the active layer and the crystalline silicon film with the small grain diameter is thermally oxidized, the roughness of the thermal oxidation film can be certainly lessened. However, if crystals with large grain diameters are included in the silicon film to be thermally oxidized, even if the number of the crystals is one, the film thickness of the active layer thereunder becomes irregular, and fluctuation of TFT characteristics occurs in the same substrate, so that it is not preferable. In order to solve this problem, strict control of the crystal grain diameter has been indispensable. As a method of strictly controlling the grain diameter, a method of carrying out crystallization at the same time as film formation is superior in that a film formation speed and temperature can be controlled at the film formation. Although it has been possible to make crystals have uniform grain diameters of 100 nm or less by using this method and by strictly controlling conditions, the control conditions are severe and cannot be easily attained. Besides, for the purpose of meeting a request for high speed operation, the film thickness of an active layer or a gate insulating film has been decreased, and crystals have been required to have uniform smaller grain diameters.

In the first place, if only an amorphous silicon film can be directly thermally oxidized, the thermal oxidation step can be used without any problem. However, it has been considered to be difficult. This is because thermal oxidation of an amorphous silicon film generally requires a temperature of 800° C. or more, and crystallization starts at about a temperature of 600° C. in the process of a temperature rise. Further, in the thus crystallized silicon film, it is difficult to control nucleus production, crystal grain diameter, or the like in the crystallizing step, so that the silicon film comes to have random and irregular crystals. When this film is thermally oxidized, irregular roughness is formed on a thermal oxidation film, so that it has not been preferable.

SUMMARY OF THE INVENTION

An object of the present invention is to solve the foregoing problems and to manufacture a TFT with superior characteristics by a thermal oxidation step. Further, another object of the present invention is to manufacture a semiconductor device with good performance by using the TFT. Thus, an object of the present invention is to directly thermally oxidize an amorphous silicon film, if possible.

According to an aspect of the present invention, a method of manufacturing a semiconductor device comprises a step of forming a crystalline semiconductor film on a substrate; a step of forming an amorphous semiconductor film on the crystalline semiconductor film; and a step of forming a thermal oxidation film by thermal oxidation of the amorphous semiconductor film; and is characterized in that an impurity for suppressing crystallization is added to the amorphous semiconductor film.

According to another aspect of the present invention, a method of manufacturing a semiconductor device comprises a step of forming a crystalline silicon film on a substrate; a step of forming an amorphous silicon film on the crystalline silicon film; and a step of forming a thermal oxidation film by thermal oxidation of the amorphous silicon film; and is characterized in that an impurity selected from the group consisting of nitrogen, oxygen, and carbon is added to the amorphous silicon film.

According to still another aspect of the present invention, a method of manufacturing a semiconductor device comprises a step of forming a crystalline silicon film on a substrate; a step of forming an amorphous silicon film on the crystalline silicon film; and a step of forming a gate insulating film by thermal oxidation of the amorphous silicon film; and is characterized in that an impurity selected from the group consisting of nitrogen, oxygen, and carbon is added to the amorphous silicon film.

The present inventors have ascertained that when oxygen is added to an amorphous silicon film, crystallization is suppressed. Crystallization progresses in such a manner that adjacent silicon atoms are sequentially bonded to form a network. It is conceivable that in the process of formation of the network, if an impurity such as oxygen exists among silicon atoms, a bond between silicon atoms is cut, so that suppression of crystallization occurs. Thus, if oxygen is intentionally added to the amorphous silicon film, crystallization of the amorphous silicon film can be suppressed, and the film can be easily thermally oxidized in the state of an amorphous or microcrystalline. An impurity added to the amorphous silicon film is not limited to oxygen, but any atom may be used as long as it is known that the atom is easily diffused among silicon atoms, and is bonded with the silicon atom to cut the bond between silicon atoms. Nitrogen, carbon, and the like may be used other than oxygen.

As shown in FIGS. 1A and 1B, in the present invention, an impurity for suppressing crystallization is added to an amorphous silicon film, and the amorphous silicon film 401 is thermally oxidized. As a result, a thermal oxidation film 402 with little roughness and substantially uniform film thickness can be easily formed as compared with the prior art. This is because crystallization is suppressed by addition of the impurity and the silicon film in the state of the amorphous or microcrystalline can be thermally oxidized. The effect of suppressing the crystallization can be enhanced by raising the addition concentration of the impurity. However, when the concentration becomes excessively high, the film becomes an insulating film, so that a thermal oxidation step becomes difficult. Thus, it is necessary to control the concentration of the impurity. Besides, since crystallization is suppressed by addition of the impurity, if there is a portion where an impurity is not added, only that portion is crystallized. Thus, thermal oxidation speed becomes different in different places, which causes roughness on the thermal oxidation film. Thus, it is necessary to uniformly add the impurity. As a method in which the concentration of an impurity is controlled and the impurity is uniformly added, there is a method in which an impurity gas is mixed with a film forming gas at film formation of an amorphous silicon film. When this method is used, it is possible to form an amorphous silicon film in which an impurity with an objective concentration is uniformly added. Besides, a method in which an impurity is added by a method such as ion implantation after formation of an amorphous silicon film, is also effective.

When the manufacturing method of the present invention is used, the grain diameters of microcrystals can be made uniform to be 20 nm or less. Further, when the addition concentration of impurity or the speed of temperature rise in the thermal oxidation is controlled, the grain diameters of crystals can be made uniform to be 10 nm or less. The interval of roughness of the thermal oxidation film formed by the thermal oxidation of this microcrystalline silicon film can be made 20 nm or less (10 nm or less in accordance with conditions), which is not larger than the grain diameter. Thus, the roughness is extremely small and the thermal oxidation film substantially having no roughness can be formed. Like this, according to the present invention, since the size of roughness of the thermal oxidation film can be made about 1/10 of that of the prior art, it is a technique which can cope with a tendency that an active layer or a gate insulating film becomes thinner, and with which, a semiconductor device capable of operating at high speed can be manufactured.

DETAILED DESCRIPTION OF THE PREFERRED EMBODIMENTS

Figure 1A:
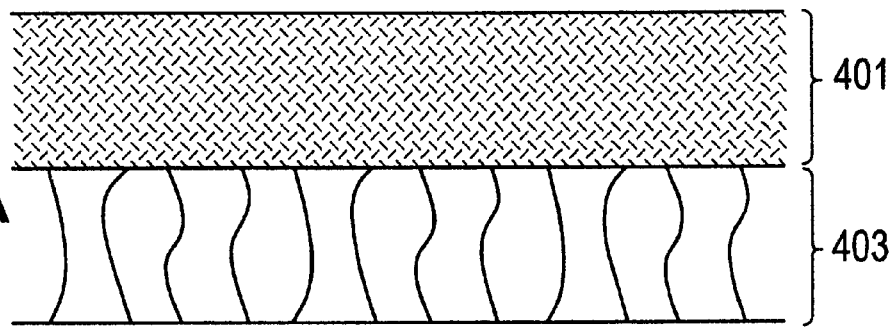
FIGS. 1A and 1B are conceptual views showing a thermal oxidation step of the present invention.
Figure 1B:
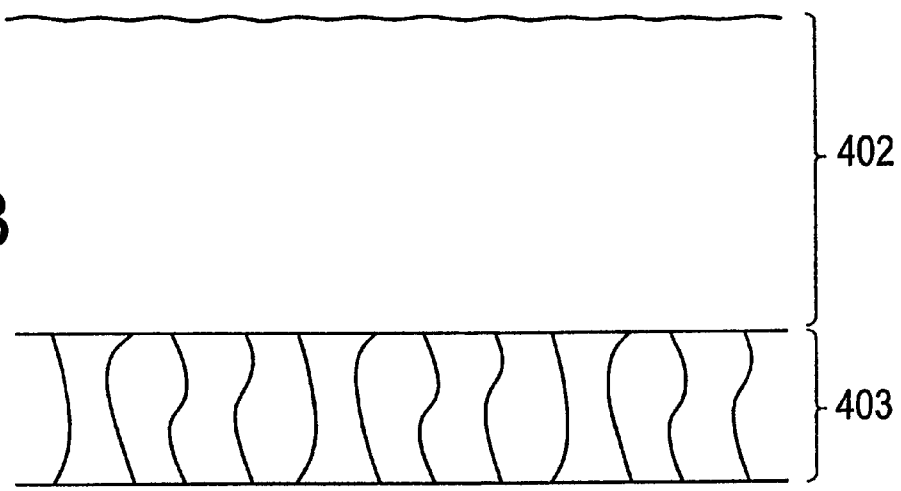
Figure 2A:
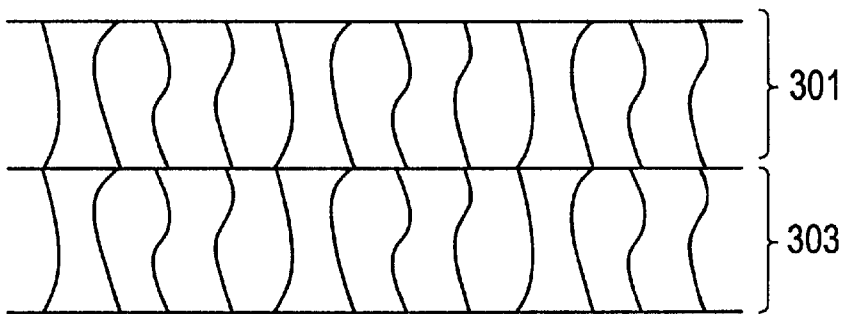
FIGS. 2A and 2B are conceptual views showing a conventional thermal oxidation step.
Figure 2B:
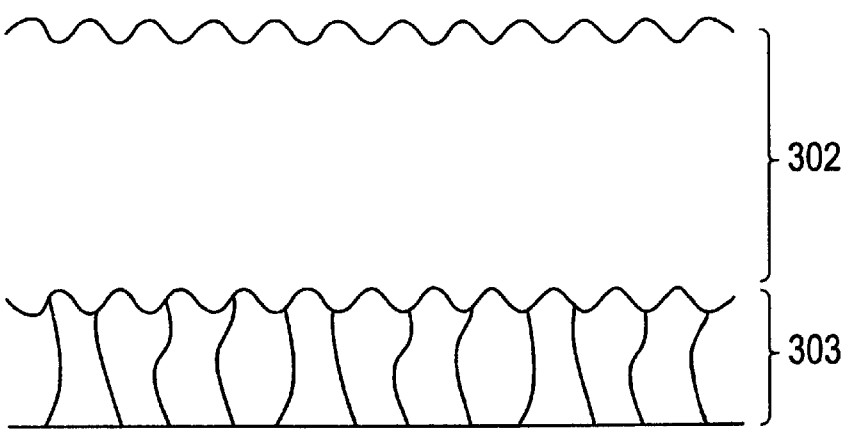

As shown in FIGS. 1A and 1B, in the present invention, an amorphous silicon film 401 is formed on a crystalline silicon film 403 used as an active layer. An impurity for suppressing crystallization, such as nitrogen, oxygen, or carbon, is added to the amorphous silicon film 401. As the amorphous silicon film 401 is thermally oxidized, that is, as Si–O bonds are formed, unreacted inter-lattice silicon atoms are produced and diffused, and are supplied to lattice defects of the crystalline silicon film 403. In this way, the lattice defects of the crystalline silicon film are compensated, so that the mobility of a TFT using this crystalline silicon film can be improved. Besides, since crystallization of the amorphous silicon film 401 is suppressed by addition of the impurity, it can be thermally oxidized in the state of an amorphous or microcrystalline, so that a thermal oxidation film 402 with a small roughness can be obtained. By using this thermal oxidation step, generation of a gate leak can be suppressed, fluctuation of TFT characteristics in the same substrate can be suppressed to the minimum, and a semiconductor device capable of operating at high speed can be manufactured.

Here, as a method of forming the amorphous silicon film to which the impurity such as nitrogen, oxygen or carbon is added, it is appropriate that a method in which the impurity is mixed in a film forming gas and is added by a low pressure CVD method, plasma CVD method, or the like at the same time as film formation, is used. As an impurity gas to be mixed, there are enumerated carbon oxide such as CO or $CO_2$, hydrocarbon such as methane, nitrogen oxide such as NO, $NO_2$, or $N_2O$, hydronitrogen such as ammonia or hydrazine, nitrogen gas, oxygen gas, and the like. It is also possible to use a method in which, after the amorphous silicon film is formed, an impurity is added by ion injection, ion doping, ion implantation, plasma doping, laser doping, or the like. Alternatively, this method may be combined with the foregoing method of adding an impurity at the same time as film formation. It is desirable that the concentration of the added impurity is such that the minimum value obtained by SIMS (Secondary Ion Mass Spectroscopy) is $1 \times 10^{19}$ atoms/$cm^3$ or more and $5 \times 10^{21}$ atoms/$cm^3$ or less, preferably from $1 \times 10^{20}$ atoms/$cm^3$ or more and $1 \times 10^{21}$ atoms/$cm^3$ or less.

In the following, preferred embodiments of the present invention will be described in more detail.

[Embodiment 1]

Figure 3A:
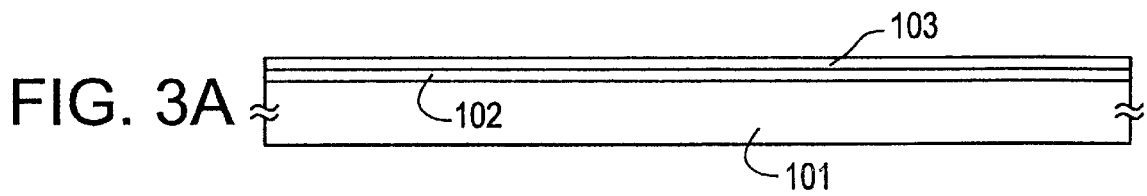
FIGS. 3A to 3D are views showing manufacturing steps of TFTs of embodiment 1.

In this embodiment, an example in which a thermal oxidation film covering a crystalline silicon film is used as a gate insulating film, will be described with reference to FIGS. 1A and 1B, and FIGS. 3A to 5C. First, as shown in FIG. 3A, a substrate 101 (in this embodiment, quartz substrate) with high heat resistance is prepared, and an insulating film 102 with a thickness of 300 nm is formed as an under film on the substrate. The insulating film is one of a silicon oxide film (SiOx), a silicon nitride film (SixNy) and a silicon nitride oxide film (SiOxNy) or a laminate film thereof. Instead of the quartz substrate, a silicon substrate may be used. In that case, the under film may be made of a thermal oxidation film.

After the substrate having the insulating surface is prepared in this way, an amorphous silicon film 103 is formed by a low pressure CVD method. It is appropriate that the film thickness of the amorphous silicon film is made 20 to 100 nm (preferably 40 to 75 nm). In this embodiment, the thickness of the film formation is made 50 nm. If a film quality comparable with that of the amorphous silicon film formed by the low pressure CVD method can be obtained, a plasma CVD method may be used. Instead of the amorphous silicon film, another amorphous semiconductor film, such as $Si_xGe_{1-x}$ (0<X<1) which contains germanium in an amorphous silicon film, may be used.

Figure 3B:

Thereafter, after dehydrogenating at about 450° C. for about one hour is carried out, a heat treatment at 500 to 700° C. (typically 550 to 650° C., preferably 570° C.) for 4 to 24 hours is carried out in an inert gas atmosphere, hydrogen atmosphere, or oxygen atmosphere, so that crystallization of the amorphous film is carried out. In this embodiment, a heat treatment is carried out at 570° C. for 14 hours to progress the crystallization. Incidentally, as a forming method of the crystalline silicon film, any well-known means such as a method of using laser annealing may be used. Thereafter, as shown in FIG. 3B, the crystalline silicon film is patterned to obtain active layers 403a, 403b, and 403c.

Figure 3C:

An amorphous silicon film 401 is formed so as to cover the obtained active layers 403a, 403b, and 403c by a plasma CVD method or low pressure CVD method (FIG. 3C). $N_2O$ and $SiH_4$ are used as a film forming gas, the ratio of introduced $N_2O$ to $SiH_4$ is made an R ratio (R ratio=$N_2O$/$SiH_4$) and the R ratio is made about 1 to 10, to that the amorphous silicon film 401 to which oxygen and nitrogen are added is obtained. In this embodiment, since a thermal oxidation film obtained by thermal oxidation of the amorphous silicon film 401 is used as a gate insulating film, it is necessary to make the film thickness of the amorphous silicon film 401 20 to 100 nm. In this embodiment, the film thickness is made 50 nm.

Figure 3D:
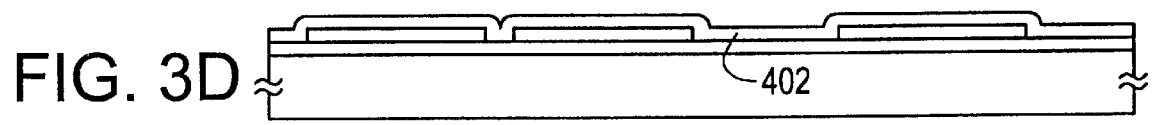

Thereafter, as shown in FIG. 1A and FIG. 3D, a heat treatment of the amorphous silicon film 401 is carried out at a temperature of 800 to 1100° C. (preferably 950 to 1050° C.) in an oxidizing atmosphere, so that a thermal oxidation film 402 is formed. In this thermal oxidation step, in order to suppress crystallization of the thermally oxidized amorphous silicon film 401, it is important to quickly raise the temperature up to a target heat treatment temperature. As the amorphous silicon film 401 is thermally oxidized, that is, as Si—O bonds are formed, unreacted inter-lattice silicon atoms are produced, diffused, and are supplied to lattice defects of the active layer made of the crystalline silicon film 403. In this way, the lattice defects of the crystalline silicon film are compensated and the mobility of a TFT using the crystalline silicon film as the active layer can be improved. Incidentally, it is appropriate that the oxidizing atmosphere is made a dry $O_2$ atmosphere, wet $O_2$ atmosphere, or atmosphere containing a halogen element (typically hydrogen chloride). In this embodiment, temperature and time in the thermal oxidation step are made conditions where a thermal oxidation film with a thickness of 100 nm is formed (950° C., 60 min).

Incidentally, like this, the structure in which the amorphous silicon film is formed so as to cover the active layer and the thermal oxidation step is carried out, is important in the present invention. Because the crystal grain diameter of the active layer is large, when the active layer is thermally oxidized, a large irregular roughness is produced, which causes such a problem that fluctuation in TFT characteristics occurs in the same substrate.

Besides, it is necessary to carry out the thermal oxidation step of the present invention under the conditions that distortion, deformation, and the like of the substrate caused by heating are within the allowable range. For example, it is appropriate that the upper limit of heat temperature is determined in view of the distortion point of the substrate, and it becomes about 1000° C. in the case where the quartz substrate is used.

Figure 4A:
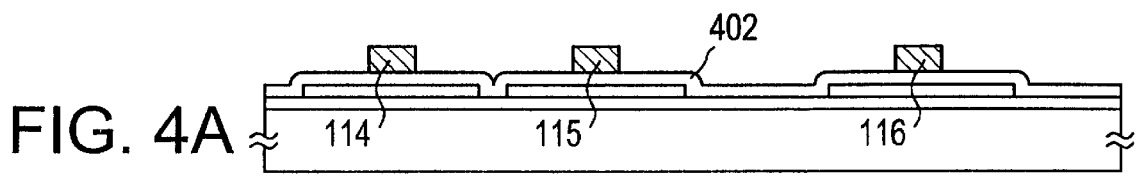
FIGS. 4A to 4D are views showing manufacturing steps of the TFTs of embodiment 1.

After compensation of defects of the crystalline silicon film is carried out in the manner as described above, gate electrodes 114 to 116 made of crystalline silicon films presenting conductivity are formed as shown in FIG. 4A. In this embodiment, the crystalline silicon film (film thickness is 200 to 300 nm) containing an impurity (phosphorus) presenting an N type is used.

After the gate electrodes 114 to 116 are formed, the thermal oxidation film 402 is etched by a dry etching method with the gate electrodes 114 to 116 as masks. In this embodiment, a $CHF_3$ gas is used to etch the silicon oxide film.

By this step, a gate insulating film is formed just under the gate electrode (and gate wiring). Of course, the portion remained under the gate electrode is a portion which actually functions as the gate insulating film.

Figure 4B:
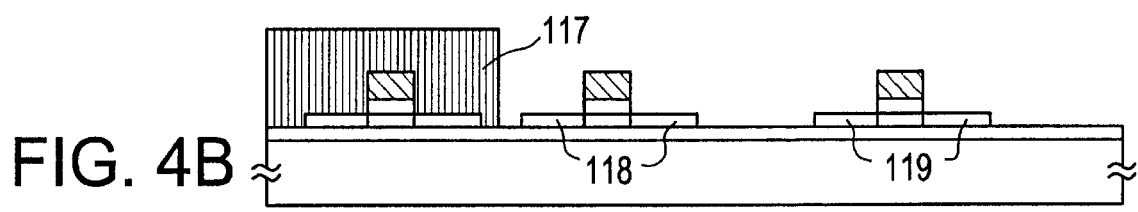

Next, a region which becomes a PTFT is concealed with a resist mask 117, and an impurity (phosphorus in this embodiment) giving an N type is added by an ion implantation method or plasma doping method. Since a part of low concentration impurity regions 118 and 119 formed at this time becomes an LDD (Lightly Doped Drain) region later, phosphorus with a concentration of $1\times10^{17}$ to $5\times10^{18}$ atoms/$cm^3$ is added (FIG. 4B).

Next, after the resist mask 117 is removed, a region which becomes an NTFT is concealed with a resist mask 120, and an impurity (boron in this embodiment) for giving a P type is added by an ion implantation method or plasma doping method. Similarly to the case of phosphorus, a low concentration impurity region 121 is also formed at this time (FIG. 4C).

Figure 4C:
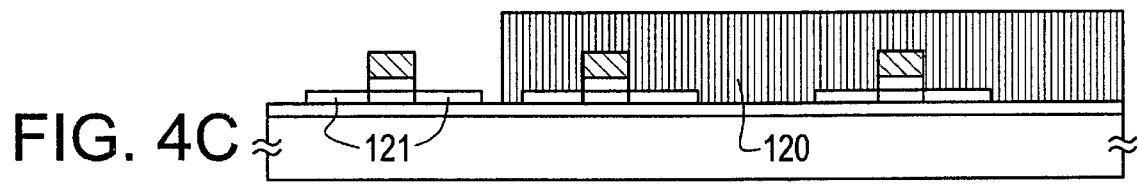
Figure 4D:
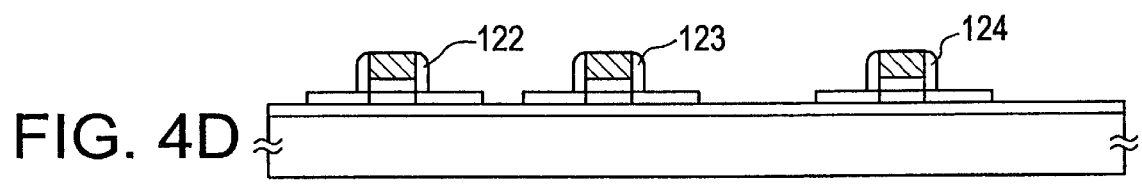

After the state shown in FIG. 4C is obtained in this way, the resist mask 120 is removed, and then, side walls 122 to 124 are formed by using an etchback method. In this embodiment, the side walls 122 to 124 are made of silicon nitride films. Other than those, silicon oxide films or silicon oxide nitride films may be used (FIG. 4D).

After the side walls 122 to 124 are formed in this way, the region which becomes the PTFT is again concealed with a resist mask 125, and phosphorus is added. At this time, the dosage is made higher than that in the previous adding step.

By this adding step of phosphorus, a source region 126, a drain region 127, a low concentration impurity region (LDD region) 128, and a channel forming region 129 of an NTFT constituting a CMOS circuit are defined. Besides, a source region 130, a drain region 131, a low concentration impurity region (LDD region) 132, and a channel formation region 133 of an NTFT constituting a pixel matrix circuit are defined (FIG., 5A).

Figure 5A:
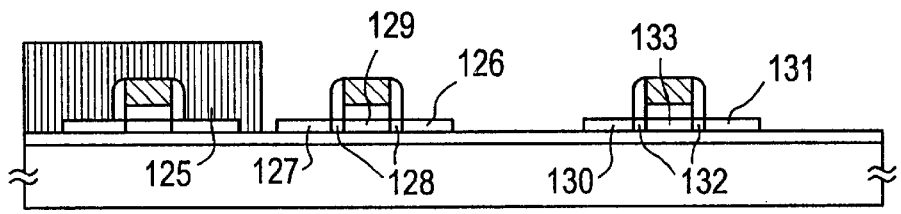
FIGS. 5A to 5C are views showing manufacturing steps of the TFTs of embodiment 1.
Figure 5B:
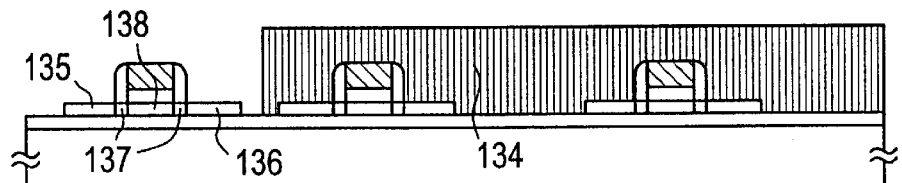

Next, after the resist mask 125 is removed, the region which becomes the NTFT is concealed with a resist mask 134, and boron with a dosage higher than that in the previous step is added. By this adding step of boron, a source region 135, a drain region 136, a low concentration impurity region (LDD region) 137, and a channel forming region 138 of a PTFT constituting the CMOS circuit are defined (FIG. 5B).

After the adding steps of impurities to the active layers are ended in the manner as described above, a heat treatment is carried out by furnace annealing, laser annealing, or lamp annealing, and activation of added impurities is carried out. At this time, damage in the active layers received by the addition of impurities is also repaired.

Channel forming regions 129, 133 and 138 are not added with any impurity element and are intrinsic or substantially intrinsic regions. Here, the term "substantially intrinsic" means that the concentration of impurity to give an N type or P type is not higher than the spin density of a channel forming region, or the concentration of impurity is within the range of $1\times10^{14}$ to $1\times10^{17}$ atoms/$cm^3$.

Next, a first interlayer insulating film 139 made of a laminate film of a silicon nitride film with a thickness of 25 nm and a silicon oxide film with a thickness of 900 nm is formed. Then source electrodes 140 to 142, and drain electrodes 143 and 144 made of laminate films of Ti/Al/Ti (film thickness is 100/500/100 nm, respectively) are formed.

Next, a second interlayer insulating film of a laminate structure of a silicon nitride film 145 with a thickness of 50 nm, a silicon oxide film (not shown) with a thickness of 20 nm, and a polyimide film 146 with a thickness of 1 micrometer is formed. Other than polyimide, another organic resin film such as acryl or polyamide may be used. The silicon oxide film with a thickness of 20 nm in this case functions as an etching stopper when the polyimide film 146 is dry-etched.

After the second interlayer insulating film is formed, in a region where an auxiliary capacitance is subsequently formed, the polyimide film 146 is etched to provide an opening portion. At this time, the bottom portion of the opening portion is made the state in which either the silicon nitride film 145 remains on the bottom portion, or both of the silicon nitride film 145 and the silicon oxide film (not shown) remain on the bottom portion.

Then a titanium film with a thickness of 300 nm is formed, and a black mask 147 is formed by patterning. The black mask 147 is disposed at a portion over the pixel matrix circuit which requires light-shielding to a TFT, a wiring portion, and the like.

At this time, the foregoing opening portion becomes a state in which the drain electrode 144 of the pixel matrix circuit and the black mask 147 are adjacent to each other while sandwiching the silicon nitride film 145 (or laminate film of silicon nitride film and silicon oxide film therebetween). In this embodiment, the black mask 147 is held at a fixed potential, and an auxiliary capacitance 148 having the drain electrode 144 as a lower electrode and the black mask 147 as an upper electrode is constituted. In this case, since the dielectric is very thin and its relative dielectric constant is large, large capacitance can be secured.

After the black mask 147 and the auxiliary capacitance 148 are formed in this way, a polyimide film with a thickness of 1 micrometer is formed as a third interlayer insulating film 149. Then a contact hole is formed and a pixel electrode 150 made of a transparent conductive film (typically ITO) with a thickness of 120 nm is formed.

Figure 5C:
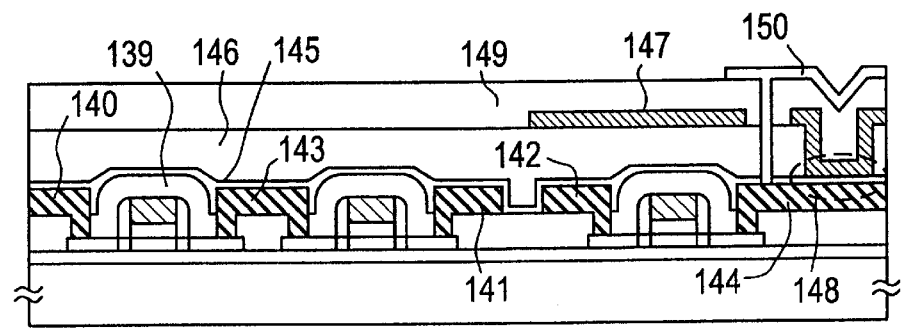

Finally, a heat treatment at 350° C. for about 2 hours is carried out in a hydrogen atmosphere, and hydrogenating of the entire of the device is carried out. In this way, an active matrix substrate as shown in FIG. 5C is completed. Thereafter, if a liquid crystal layer is sandwiched between the substrate and an opposite substrate by a well-known cell assembling step, an active matrix type liquid crystal display device (transmission type) is completed.

Incidentally, the structure of the active matrix substrate is not limited to this embodiment, but any structure may be adopted. That is, as long as the structure can satisfy structural conditions of the present invention, an operator can be free to design a TFT structure, circuit arrangement, and the like.

For example, in this embodiment, although the transparent conductive film is used as the pixel electrode, if this is substituted for a material with high reflectivity, such as an aluminum alloy film, a reflection type active matrix liquid crystal display device can be easily realized. In the transmission type, it is necessary to use a translucent substrate as an active matrix type substrate, while in the case of the reflection type, it is not necessary to use a translucent substrate, and a light-shielding substrate may be used.

By using the thermal oxidation step of this embodiment, the roughness of a thermal oxidation film can be made small, so that an active layer where defects are compensated, and a dense gate insulating film with a high insulating property can be reliably obtained. That is, generation of a gate leak is suppressed, fluctuation of TFT characteristics in the same substrate is suppressed to the minimum, and a semiconductor device capable of functioning at high speed can be manufactured. Incidentally, in this embodiment, oxygen and nitrogen are used as impurities added to the amorphous silicon film, if an amorphous silicon film added with at least one kind of impurity selected from nitrogen, oxygen, and carbon is used, similar effects to this embodiment can be obtained.

[Embodiment 2]

In the manufacturing steps shown in embodiment 1, as a method of forming an amorphous silicon film added with an impurity, a method in which an impurity is mixed in a film forming gas, and addition is made at the same time as the film formation by a low pressure CVD method, is used. However, a method in which after an amorphous silicon film is formed, an impurity is added by the ion implantation method or the like, may be used. In that case, such a method may be adopted that, for example, $NH_3$ is ionized and is implanted in the amorphous silicon film. Besides, such a method may be adopted that instead of ammonia, a material containing nitrogen, oxygen, or carbon is ionized and is implanted.

[Embodiment 3]

In the manufacturing steps shown in embodiment 1, although the thermal oxidation film is used as a gate insulating film, it is acceptable even if this thermal oxidation film does not necessarily function as the gate insulating film. In that case, for the purpose of decreasing lattice defects, a crystalline silicon film is covered with an amorphous silicon film and a thermal oxidation step is carried out.

It is also possible to adopt such a structure that the thermal oxidation film is once removed, and a gate insulating film is newly formed. Incidentally, after the gate insulating film is formed, a thermal oxidation step may be carried out again.

[Embodiment 4]

Figure 6:
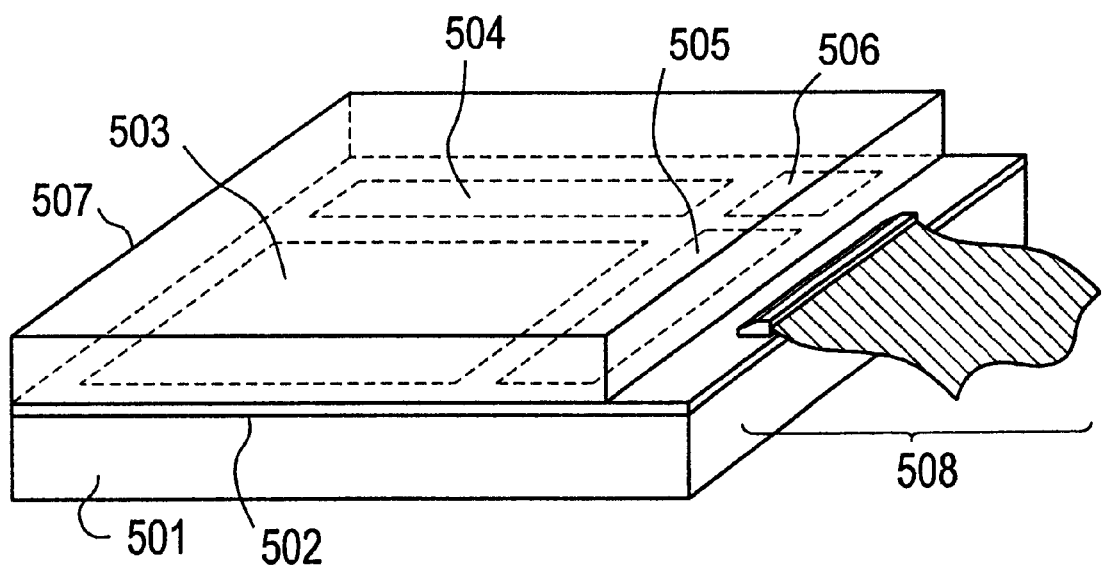
FIG. 6 is a liquid crystal module of embodiment 3.

An example in which an active matrix substrate with a structure shown in embodiments 1 to 3 is used to constitute a liquid crystal display device, will be described with reference to FIG. 6. FIG. 6 shows a portion corresponding to a main body of a liquid crystal display device, which is called a liquid crystal module as well.

In FIG. 6, reference numeral 501 denotes a substrate (any of quartz, silicon wafer, and crystallized glass may be used), and 502 denotes an insulating film as an under film, and thereon, a plurality of TFTs are formed from semiconductor films manufactured in accordance with the manufacturing steps of the present invention.

These TFTs constitute a pixel matrix circuit 503, a gate side driver circuit 504, a source side driver circuit 505, and a logic circuit 506 on the substrate. An opposite substrate 507 is bonded to such an active matrix substrate. A liquid crystal layer (not shown) is sandwiched between the active matrix substrate and the opposite substrate 507.

In the structure shown in FIG. 6, it is desirable to make all sides of the active matrix substrate except one side flush with sides of the opposite substrate. By this, the number of pieces obtained from a large substrate can be effectively increased.

At the one side, a part of the opposite substrate is removed so that a part of the active matrix substrate is exposed, and an FPC (Flexible Printed Circuit) 508 is attached thereto. An IC chip (semiconductor circuit constituted by MOSFETs formed on single crystal silicon) may optionally be mounted thereon.

Since the TFT with an active layer made of the semiconductor film of the present invention has an extremely high operation speed, a signal processing circuit driven at a high frequency of several hundreds MHZ to several GHz can be integrally formed on the same substrate as the pixel matrix circuit. That is, the liquid crystal module shown in FIG. 6 realizes a system-on-panel.

In this embodiment, the description has been made on the case where the present invention is applied to the liquid crystal display device. However, an active matrix type EL (electroluminescence) display device and the like can be constructed. Besides, it is also possible to form an image sensor with a photoelectric conversion layer, and the like on the same substrate.

Incidentally, like the foregoing liquid crystal display device, EL display device, and image sensor, a device having a function to convert an optical signal into an electric signal or an electric signal into an optical signal is defined as an electro-optical device. The present invention can be applied to any electro-optical device as long as the device can be formed on a substrate having an insulating surface by using a semiconductor film.

[Embodiment 5]

The present invention can construct not only an electro-optical device as shown in embodiment 4 but also a thin film integrated circuit (or semiconductor circuit) in which functional circuits are integrated. For example, an arithmetic circuit such as a microprocessor, a high frequency circuit (MMIC: Microwave Module IC) for a portable equipment, and the like can be constructed.

Further, it is also possible to construct a semiconductor circuit of three-dimensional structure by positively utilizing the merits of a TFT using a thin film, and to construct a highly densed integrated VLSI circuit. Like this, it is possible to construct a semiconductor circuit with extremely ample functions by using the TFT of the present invention. Incidentally, in the present specification, the semiconductor circuit is defined as an electric circuit which controls and converts an electric signal by use of semiconductor characteristics.

[Embodiment 6]

In this embodiment, examples of electronic equipment (applied products) incorporating an electro-optical device or semiconductor circuit as described in embodiment 4 or embodiment 5 will be shown in FIGS. 7A to 7F, FIGS. 8A to 8D, and FIGS. 9A to 9C. Incidentally, the electronic equipment is defined as a product incorporating a semiconductor circuit and/or an electro-optical device.

As such electronic equipment, a video camera, a digital camera, a projector (rear type or front type), a head mount display (a goggle type display), a car navigation system, a personal computer, a portable information terminal (mobile computer, portable telephone, electric book,etc.) and the like are enumerated. Examples of those are shown in FIG. 7A to FIG. 7F, FIGS. 8A and 8B.

Figure 7A:
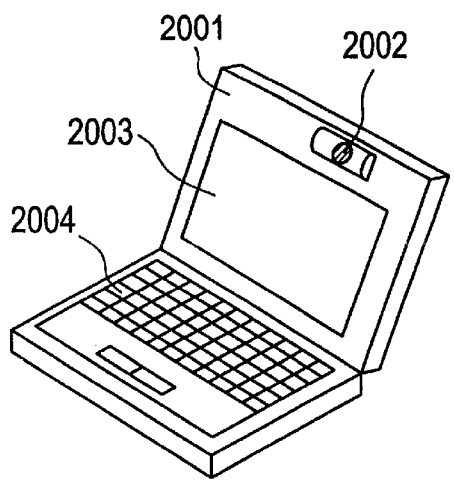
FIGS. 7A to 7F, FIGS. 8A to 8D, and FIGS. 9A to 9C are views showing electronic devices of embodiment 5.

FIG. 7A shows a personal computer which is constituted by a main body 2001, an image input portion 2002, a display device 2003, and a keyboard 2004. The present invention can be applied to the image input portion 2002, the display device 2003, and other signal control circuits.

Figure 7B:
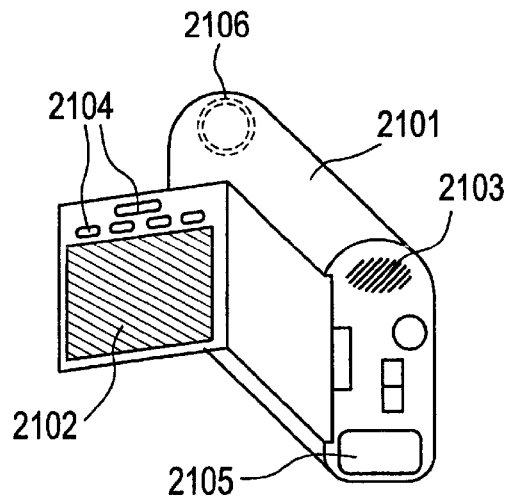

FIG. 7B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 7C:
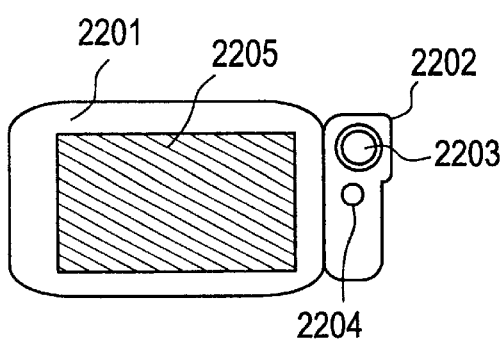

FIG. 7C shows a mobile computer which is constituted by a main body 2201, a camera portion 2202, an image receiving portion 2203, an operation switch 2204, and a display device 2205. The present invention can be applied to the display device 2205 and other signal control circuits.

Figure 7D:
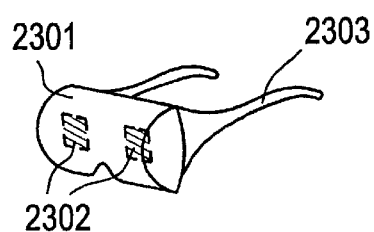

FIG. 7D shows a goggle type display which is constituted by a main body 2301, a display device 2302, and an arm portion 2303.

The present invention can be applied to the display device 2302 and other signal control circuits.

Figure 7E:
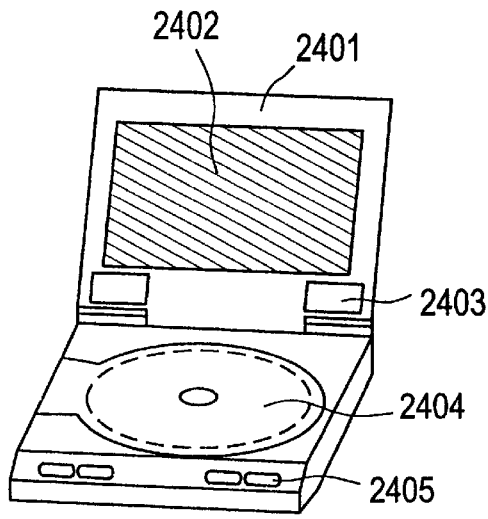

FIG. 7E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an eternal input portion 2406. This apparatus includes a DVD (digital Versatile Disc), a CD and the like as the recording medium for appreciating music and movie, playing a game, and Internet. The present invention can be applied to the display device 2402 and other signal control circuits.

Figure 7F:
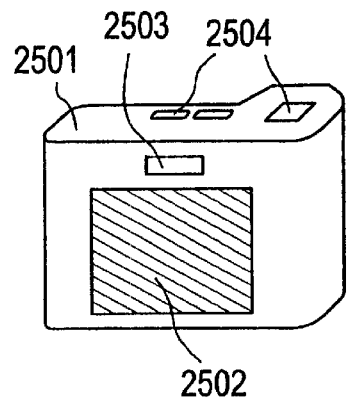

FIG. 7F shows a digital camera which is constituted by a main boy 2501, a display device 2502, an eyepiece portion 2503, an operation switch 2504 and an image receiving portion (not shown). The present invention can be applied to the display device 2502 and other signal control circuits.

Figure 8A:
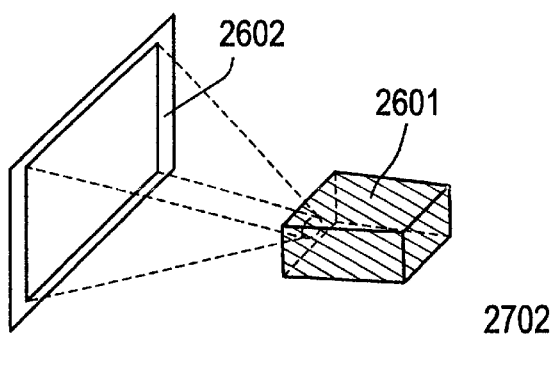

FIG. 8A shows a front type projector which is constituted by a light source optical system and a display device 2601, and a screen 2602. The present invention can be applied to the display device and other signal control circuits.

Figure 8B:
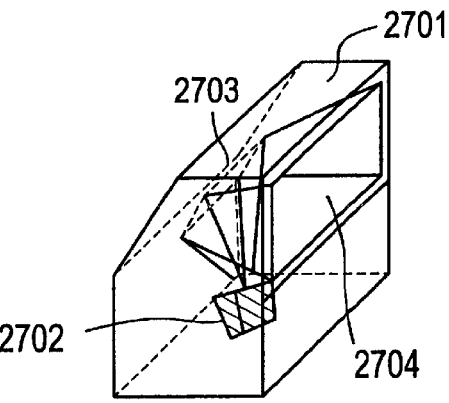

FIG. 8B shows a rear type projector which is constituted by a main body 2701, a light source optical system and a display device 2702, a mirror 2703 and a screen 2704. The present invention can be applied to the display device and other signal control circuits.

Figure 8C:
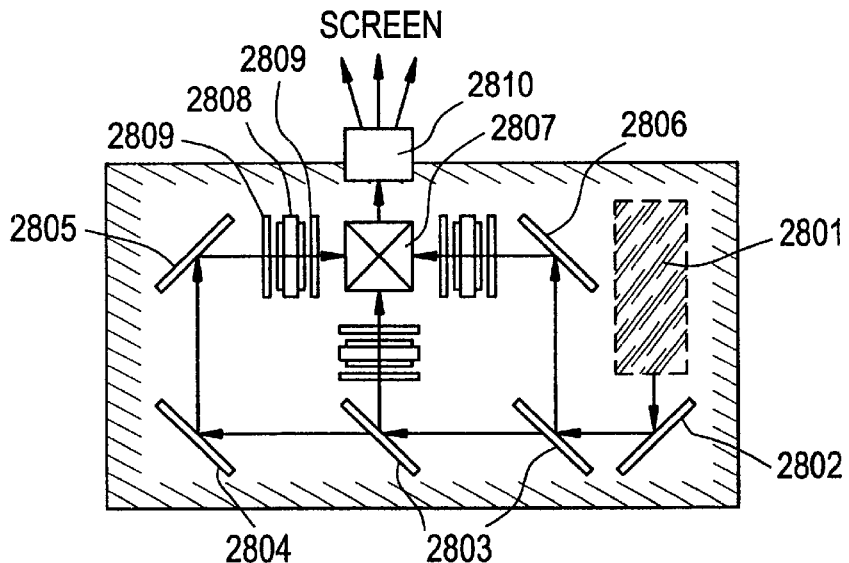

FIG. 8C shows an example structure of a light source optical system and a display device 2601 in FIG. 8A, or 2702 in FIG. 8B. Each of numerals 2601 and 2702 includes a light source optical system 2801, mirrors 2802, 2804–2806, a dichroic mirror 2803, another optical system 2807, a display device 2808, a phase difference plate 2809, and a projection optical system 2810. The projection optical system 2810 is constituted by a plurality of optical lenses equipped with a projection lens. Such a projection system as shown in FIG. 8C is called a three-plate type since this structure includes three plates of display devices. Further, it is proper for a researcher to form, in an optical path indicated by an arrow in FIG. 8C, an optical lens, a film with a polarizing characteristics, a film to control a phase difference, an IR film, etc.

Figure 8D:
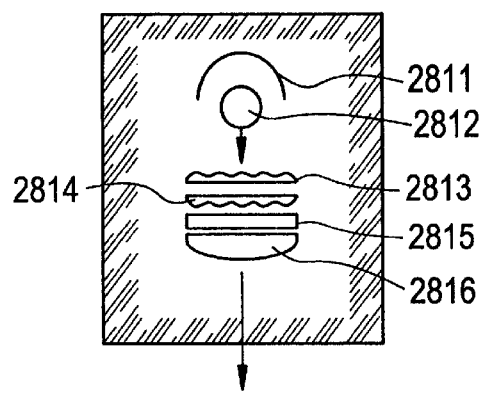

FIG. 8D shown an example structure of a light source optical system 2801 in FIG. 8C. In this embodiment, the light source optical system 2801 includes a reflector 2811, a light source 2812, lens arrays 2813 and 2814, a polarizing conversion element 2815 and a condenser lens 2816. However, the present invention is not specifically limited by this embodiment because it is just an example. For example, in an optical path, an optical lens, a film with a polarizing characteristics, a film to control a phase difference, an IR film, etc. can be properly formed.

Figure 9A:
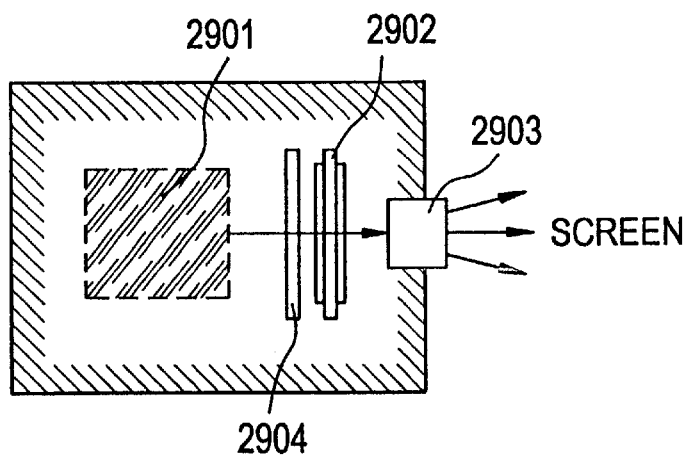

While FIG. 8C shows an example of the three-plate type, FIG. 9A shows an example of single-plate type. A light source optical system 2901, a display device 2902, a projection optical system 2903 are included in a light source optical system and a display device shown in FIG. 9A. It is possible to apply the light source optical system and display device shown in FIG. 9A to the light source optical system and display device 2601 shown in FIG. 8A, or 2702 in FIG. 8B. Further, the light source optical system 2901 can be applied by the light source optical system shown in FIG. 8D. In addition, the display device 2902 is equipped with a color filter (not shown), so that display image is colored.

Figure 9B:
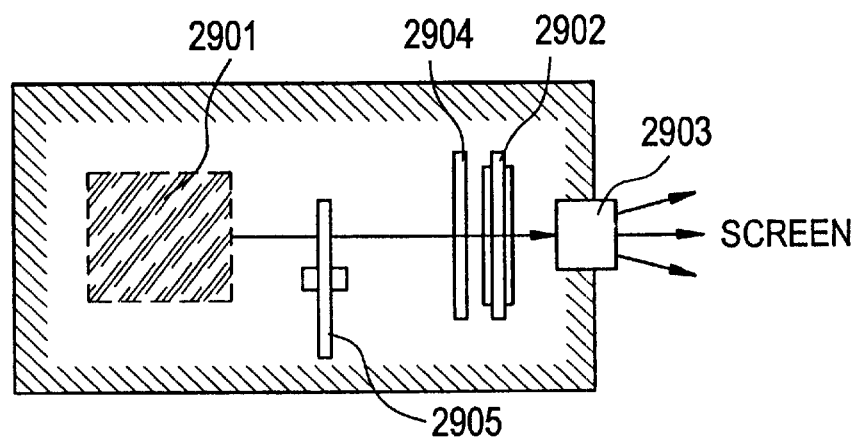

FIG. 9B shows an applied example of a light source optical system and a display device which is applied by FIG. 9A. Instead of forming a color filter, a display image is colored by RGB rotary color filter disc 2905. It is possible to apply the light source optical system and display device shown in FIG. 9B to the light source optical system and display device 2601 shown in FIG. 8A, or 2702 in FIG. 8B.

Figure 9C:
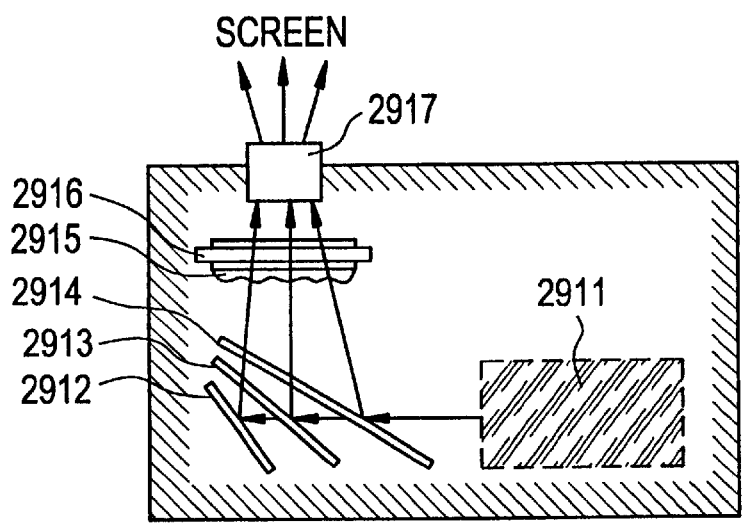

A structure of the light source optical system and display device, as shown in FIG. 9C is called as a color-fileterless single-plate type. In this structure, a display device 2916 is equipped with a microlens array 2915, and a display image is colored by a dichroic mirror (Green) 2912, a dichroic mirror (Red) 2913 and a dichroic mirror (Blue). A projection optical system 2917 is constituted by a plurality of lenses including a projection lens. It is possible to apply the light source optical system and display device shown in FIG. 9C to the light source optical system and display device 2601 shown in FIG. 8A, or 2702 in FIG. 8B. Further, as the light source optical system 2911, an optical system having a coupling lens and a collimating lens other than a light source can be applied.

As set forth above, the scope of application of the present invention is extremely wide and the present invention can be applied to electronic equipments of any field. Moreover, the present invention can be applied to any product as long as it requires an electro-optical device or a semiconductor circuit.

As described above, according to the present invention, the roughness of a thermal oxidation film can be made extremely small, and a thermal oxidation film having substantially no roughness can be obtained. As a result, it is possible to obtain a semiconductor device which has a high mobility, suppresses generation of a gate leak, suppresses fluctuation of TFT characteristics to the minimum, and can be operated at high speed.

What is claimed is:

1. A method of manufacturing a semiconductor device comprising the steps of:

forming a crystalline semiconductor film on an insulating surface;

forming an amorphous semiconductor film on said crystalline semiconductor film;

introducing an impurity for suppressing crystallization to said amorphous semiconductor film; and heating said amorphous semiconductor film in an oxidizing atmosphere at a temperature of 800–1100° C.

2. A method according to claim 1, wherein said impurity is selected from the group consisting of nitrogen, oxygen and carbon.

3. A method according to claim 1, wherein a concentration of said impurity in said amorphous semiconductor film is $1 \times 10^{19}$ atoms/cm$^3$ or more.

4. A method according to claim 1, wherein said semiconductor device is incorporated into an electronic apparatus selected from the group consisting of a personal computer, a video camera, a portable computer, a goggle type display, a player apparatus, a digital camera, a front type projector and a rear type projector.

5. A method of manufacturing a semiconductor device comprising the steps of:

forming a crystalline semiconductor film on an insulating surface;

forming an amorphous semiconductor film on said crystalline semiconductor film;

introducing an impurity for suppressing crystallization to said amorphous semiconductor film;

heat treating said amorphous semiconductor film in an oxidizing atmosphere at a temperature of 800–1100° C.;

removing said amorphous semiconductor film after the heat treating; and forming a gate insulating film over said crystalline semiconductor film.

6. A method according to claim 5, wherein said impurity is selected from the group consisting of nitrogen, oxygen and carbon.

7. A method according to claim 5, wherein a concentration of said impurity in said amorphous semiconductor film is $1\times10^{19}$ atoms/cm$^3$ or more.

8. A method according to claim 5, wherein said semiconductor device is incorporated into an electronic apparatus selected from the group consisting of a personal computer, a video camera, a portable computer, a goggle type display, a player apparatus, a digital camera, a front type projector and a rear type projector.

9. A method of manufacturing a semiconductor device comprising the steps of:

forming a crystalline semiconductor film on an insulating surface;

forming an amorphous semiconductor film on said crystalline semiconductor film;

introducing an impurity for suppressing crystallization to said amorphous semiconductor film;

forming a thermal oxide film by heating said amorphous semiconductor film in an oxidizing atmosphere at a temperature of 800–1100° C.; and forming a gate electrode on said thermal oxide film.

10. A method according to claim 9, wherein said impurity is selected from the group consisting of nitrogen, oxygen and carbon.

11. A method according to claim 9, wherein a concentration of said impurity in said amorphous semiconductor film is $1\times10^{19}$ atoms/cm$^3$ or more.

12. A method according to claim 9, wherein said semiconductor device is incorporated into an electronic apparatus selected from the group consisting of a personal computer, a video camera, a portable computer, a goggle type display, a player apparatus, a digital camera, a front type projector and a rear type projector.

13. A method of manufacturing a semiconductor device comprising the steps of:

forming a crystalline semiconductor film on an insulating surface;

forming an amorphous semiconductor film on said crystalline semiconductor film, while introducing an impurity for suppressing crystallization thereto; and heating said amorphous semiconductor film in an oxidizing atmosphere at a temperature of 800–1100° C.

14. A method according to claim 13, wherein said impurity is selected from the group consisting of nitrogen, oxygen and carbon.

15. A method according to claim 13, wherein a concentration of said impurity in said amorphous semiconductor film is $1\times10^{19}$ atoms/cm$^3$ or more.

16. A method according to claim 13, wherein said semiconductor device is incorporated into an electronic apparatus selected from the group consisting of a personal computer, a video camera, a portable computer, a goggle type display, a player apparatus, a digital camera, a front type projector and a rear type projector.

17. A method of manufacturing a semiconductor device comprising the steps of:

forming a crystalline semiconductor film on an insulating surface;

forming an amorphous semiconductor film on said crystalline semiconductor film, while introducing an impurity for suppressing crystallization thereto;

heat treating said amorphous semiconductor film in an oxidizing atmosphere at a temperature of 800–1100° C.;

removing said amorphous semiconductor film after the heat treating; and forming a gate insulating film over said crystalline semiconductor film.

18. A method according to claim 17, wherein said impurity is selected from the group consisting of nitrogen, oxygen and carbon.

19. A method according to claim 17, wherein a concentration of said impurity in said amorphous semiconductor film is $1\times10^{19}$ atoms/cm$^3$ or more.

20. A method according to claim 17, wherein said semiconductor device is incorporated into an electronic apparatus selected from the group consisting of a personal computer, a video camera, a portable computer, a goggle type display, a player apparatus, a digital camera, a front type projector and a rear type projector.

21. A method of manufacturing a semiconductor device comprising the steps of:

forming a crystalline semiconductor film on an insulating surface;

forming an amorphous semiconductor film on said crystalline semiconductor film, while introducing an impurity for suppressing crystallization thereto;

forming a thermal oxide film by heating said amorphous semiconductor film in an oxidizing atmosphere at a temperature of 800–1100° C.; and forming a gate electrode on said thermal oxide film.

22. A method according to claim 21, wherein said impurity is selected from the group consisting of nitrogen, oxygen and carbon.

23. A method according to claim 21, wherein a concentration of said impurity in said amorphous semiconductor film is $1\times10^{19}$ atoms/cm$^3$ or more.

24. A method according to claim 21, wherein said semiconductor device is incorporated into an electronic apparatus selected from the group consisting of a personal computer, a video camera, a portable computer, a goggle type display, a player apparatus, a digital camera, a front type projector and a rear type projector.

* * * * *